(12) United States Patent
Wang et al.

(10) Patent No.: US 7,972,663 B2
(45) Date of Patent: *Jul. 5, 2011

(54) METHOD AND APPARATUS FOR FORMING A HIGH QUALITY LOW TEMPERATURE SILICON NITRIDE LAYER

(75) Inventors: Shulin Wang, Campbell, CA (US); Errol Antonio C. Sanchez, Dublin, CA (US); Aihua (Steven) Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1472 days.

This patent is subject to a terminal disclaimer.

(21) Appl. No.: 10/741,417

(22) Filed: Dec. 19, 2003

(65) Prior Publication Data

US 2004/0194706 A1  Oct. 7, 2004

Related U.S. Application Data

(63) Continuation-in-part of application No. 10/327,467, filed on Dec. 20, 2002, now Pat. No. 7,172,792.

(60) Provisional application No. 60/435,813, filed on Dec. 20, 2002, now abandoned.

(51) Int. Cl.
*H05H 1/24* (2006.01)
*H05H 1/00* (2006.01)
*B05D 3/00* (2006.01)
*C04B 41/00* (2006.01)
*C08J 7/18* (2006.01)
*C23C 16/00* (2006.01)

(52) U.S. Cl. ........ 427/569; 427/578; 427/579; 427/532; 427/533; 427/535; 427/248.1

(58) Field of Classification Search ........................ None
See application file for complete search history.

(56) References Cited

U.S. PATENT DOCUMENTS

| | | | |
|---|---|---|---|
| 4,158,717 A | | 6/1979 | Nelson |
| 4,784,874 A | * | 11/1988 | Ishihara et al. ............... 427/568 |
| 4,857,140 A | | 8/1989 | Loewenstein |
| 4,877,651 A | * | 10/1989 | Dory ....................... 427/255.18 |
| 4,883,686 A | | 11/1989 | Doehler et al. |

(Continued)

FOREIGN PATENT DOCUMENTS

JP    62-051264    3/1987

(Continued)

OTHER PUBLICATIONS

European Examination Report dated Apr. 20, 2007 for EP Application No. 04814210.3.

(Continued)

*Primary Examiner* — Michael Cleveland
*Assistant Examiner* — Michael G Miller
(74) *Attorney, Agent, or Firm* — Patterson & Sheridan, L.L.P.

(57) ABSTRACT

A method of forming a silicon nitride layer is described. According to the present invention, a silicon nitride layer is deposited by thermally decomposing a silicon/nitrogen containing source gas or a silicon containing source gas and a nitrogen containing source gas at low deposition temperatures (e.g., less than 550° C.) to form a silicon nitride layer. The thermally deposited silicon nitride layer is then treated with hydrogen radicals to form a treated silicon nitride layer.

29 Claims, 5 Drawing Sheets

U.S. PATENT DOCUMENTS

| | | | | |
|---|---|---|---|---|
| 4,988,634 A * | 1/1991 | Yamazaki | | 438/285 |
| 4,992,299 A | 2/1991 | Hochberg et al. | | |
| 4,992,306 A * | 2/1991 | Hochberg et al. | | 427/255.29 |
| 5,264,724 A * | 11/1993 | Brown et al. | | 257/347 |
| 5,273,920 A | 12/1993 | Kwasnick et al. | | |
| 5,380,566 A | 1/1995 | Robertson et al. | | |
| 5,562,952 A | 10/1996 | Nakahigashi | | |
| 5,591,494 A | 1/1997 | Sato et al. | | |
| 5,632,821 A | 5/1997 | Doi | | |
| 6,001,431 A | 12/1999 | Itoh et al. | | |
| 6,017,784 A | 1/2000 | Ohta et al. | | |
| 6,087,205 A | 7/2000 | Yamamori | | |
| 6,224,950 B1 | 5/2001 | Hirata | | |
| 6,255,197 B1 * | 7/2001 | Fujimura et al. | | 438/475 |
| 6,303,777 B1 | 10/2001 | Kao et al. | | |
| 6,324,439 B1 | 11/2001 | Cheung et al. | | |
| 6,348,420 B1 | 2/2002 | Raaijmakers et al. | | |
| 6,413,887 B1 | 7/2002 | Fukuda et al. | | |
| 6,468,903 B2 | 10/2002 | Bolscher et al. | | |
| 6,486,083 B1 | 11/2002 | Mizuno et al. | | |
| 6,524,955 B2 | 2/2003 | Fukuda et al. | | |
| 6,544,900 B2 | 4/2003 | Raaijmakers et al. | | |
| 6,555,183 B2 | 4/2003 | Wang et al. | | |
| 6,583,046 B1 | 6/2003 | Okada et al. | | |
| 6,586,163 B1 | 7/2003 | Okabe et al. | | |
| 6,630,413 B2 | 10/2003 | Todd | | |
| 7,091,138 B2 | 8/2006 | Numasawa et al. | | |
| 7,172,792 B2 * | 2/2007 | Wang et al. | | 427/255.393 |
| 7,365,029 B2 | 4/2008 | Iyer et al. | | |
| 2001/0012650 A1 | 8/2001 | Kim et al. | | |
| 2002/0016084 A1 * | 2/2002 | Todd | | 438/791 |
| 2002/0090835 A1 | 7/2002 | Chakravarti et al. | | |
| 2003/0148565 A1 | 8/2003 | Yamanaka | | |
| 2003/0186324 A1 | 10/2003 | Liao et al. | | |
| 2004/0096582 A1 * | 5/2004 | Wang et al. | | 427/255.27 |
| 2004/0121085 A1 | 6/2004 | Shulin et al. | | |
| 2004/0194706 A1 | 10/2004 | Shulin et al. | | |
| 2005/0020021 A1 | 1/2005 | Fujiwara et al. | | |
| 2005/0106896 A1 | 5/2005 | Fukuchi | | |
| 2005/0145897 A1 | 7/2005 | Matsuo et al. | | |

FOREIGN PATENT DOCUMENTS

| | | |
|---|---|---|
| JP | 04-365379 | 12/1992 |
| JP | 05102040 A | 4/1993 |
| JP | 6013329 | 1/1994 |
| JP | 6132284 | 5/1994 |
| JP | 7273106 | 10/1995 |
| JP | 07283154 A | 10/1995 |
| JP | 10261658 | 9/1998 |
| JP | 2001258139 | 9/2001 |
| JP | 2003168683 A | 6/2003 |
| JP | 2003178993 A | 6/2003 |
| JP | 2005005537 A | 1/2005 |
| JP | 2006-511087 | 3/2006 |
| WO | WO 2004/057653 A | 7/2004 |
| WO | WO 2004/059707 A | 7/2004 |

OTHER PUBLICATIONS

PCT International Search Report for PCT/US04/014999, dated Jun. 24, 2005.

European Examination Report for European Application No. 03813046.4 dated Nov. 21, 2006.

Tanaka, et al., "Film Properties of Low-k Nitride Films Formed by Hexachlorodisilane and Ammonia," J. Electrochemical Soc., vol. 147 (2000) pp. 2284-2289.

Yacoubi, et al., "Analysis and Modeling of Low Pressure CVD of Silicon Nitride from a Silane-Ammonia Mixture," J. Electrochemical Society, vol. 146 (1999) pp. 3009-3017.

Notification of First Office Action dated Apr. 4, 2008 for Chinese Patent Application No. 200380107849.9.

Matsumura et al article, "Low-Temperature Chemical-Vapor Deposition of Amorphous Semiconductors and Insulators." Materials Research Society, 1993, vol. 297, pp. 109-120.

Oda et al article, "Hydrogen Radical Assisted Chemical Vapor Deposition of ZnSe." Appl. Phys.. Lett, 48(1), pp. 33-35, Jan. 1986.

Yasui et al article, "Silicon Nitride Films Grown by Hydrogen Radical Enhanced Chemical Vapor Deposition Utilizing Trisdimethylaminosilane.", Journal of Non-Crystalline Solids, 1994, vol. 169, pp. 301-305.

Notification of First Office Action dated Nov. 7, 2008 for Chinese Patent Application No. 200480038017.0.

European Examination Report dated Oct. 13, 2008 for Application No. 03814209.7.

Second Office Action in Chinese Patent Application No. 200380107849.9 dated Feb. 20, 2009.

Office Action for Korean Patent Application No. 10-2007-7031043 dated Oct. 22, 2009.

Office Action dated Jul. 10, 2009 for Chinese Patent Application No. 200480038017.0.

Office Action dated Dec. 11, 2009 for Chinese Patent Application No. 200480038017.0.

Notice of Reasons for Rejection dated Jul. 20, 2010 for Japanese Patent Application No. 2006-545824.

Thomas Reif, Doctoral Dissertation, University of Cologne (2001).

Tanaka, et al. "CVD SiN Using HCD and NH3", J. Electrochemical Soc., vol. 147 (2000) pp. 2284.

Ishihara, et al. "Low Temperature CVD of SiN Using a New Source Gas (Hydrogen Azide)" Journal of Applied Physics, vol. 31 (1992) Part 2 pp. L74-L77.

Ishihara, et al. "Low Temperature CVD of SiN from Tetra-Silane and Hydrogen Azide" Material Research Society Symposium, vol. 284 (1993) pp. 3-8.

Yeh, et al. "Low Temperature CVD of SiN Film from Hexachloro-Disilane and Hydrazine" Journal of Applied Physics, vol. 35 (1996) pp. 1509-1511.

Yoshioka, et al. "Deposition of Silicon Nitride Films by Silane-Hydrazine Process" J. Electrochemical Society, vol. 114 (1967) pp. 962-964.

Laxman, et al. "A Low Temperature Solution for Silicn Nitride Deposition" Solid State Technology, vol. 43 (2000) pp. 79, 80, 82 and 87.

Gordon, et al. "Silicon Dimethylamido Complexes and Ammonia as Precursors for Atmospheric Pressure CVD of SiN Thin Films" Chem. Mater. vol. 2 (1990) pp. 480-482.

Levy, et al. "LPCVD of SiN Using the Environmentally Benigh Precursor Tris(dimethylamino)silane" P. Electrochemical Society, vol. 96-5 (1996) pp. 239-247.

Yacoubi, et al. "LPCVD of SiN Using SiH4 and NH3" J. Electrochemical Society, vol. 146 (1999) pp. 3009.

Stuger, et al. "Aminochlorodisilanes as Precursors to Multifunctionalized Disilane Derivative" J. Organometallic Chem. vol. 547 (1997) pp. 227.

Tamao, et al. "Coupling of (Amino)alkylchlorosilanes with Lithium: New Access to Symmetrical Di- and Tetrafunctional Alkyldisilanes" Organomettalics, vol. 12 (1993) pp. 580-582.

Huber, et al. "Hexa(amino)disilanes With Saturated Cyclic Amino Ligands" Chemical Monthly, vol. 130 (1999) pp. 133-138.

Schuh, et al. "Disilany-amines—Compounds Comprising the Structural Unit Si-Si-N, as Single Source Precursors for PECVD of SiN" Zeitschrift for Anorganische and Allgemeine Chemie, vol. 619 (1993) pp. 1347-1352.

Wheeler, et al. "Aminodisilanes as Silylating Agents for Dry-Developed Positive-Tone Resists for Deep Ultraviolet (248nm) and Extreme Ultraviolet (13.5) Microlithography" Proceedings of the SPIE, vol. 2438 (1995) pp. 762-774.

Kitoh, et al. "Formation of SiN Films by PECVD Using [(CH$_3$)$_2$N]$_3$SiN$_3$," Journal of Applied Physics, vol. 33 (1994) pp. 7076-7079.

Smirnova, et al. "SiCN Films as New Materials Obtained by PCVD from Novel Precursor" Proceedings of SPIE, vol. 4467 (2001) pp. 366-376.

Klingebiel, et al. "Cyclization and Isomerization Reactions in Silylhydrazine Chemistry" Chemical Monthly, vol. 32 (2001) pp. 1105.

Notice of Reasons for Rejection dated Jun. 9, 2009 for Japanese Patent Application No. 2004-562356.

Notice of Reasons for Rejection dated Jun. 9, 2009 for Japanese Patent Application No. 2004-563816.

PCT International Search Report for PCT/US03/40793, dated Jun. 30, 2004.

Matsumura, et al. "Low-Temperature Chemical-Vapor Deposition of Amorphous Semiconductors and Insulators", Mat. Res. Soc. Symp. Proc. vol. 297 (1993) pp. 109-120.

Yamaguchi, et al. "The Effect of Hydrogen Plasma on the Properties of a-Si: H/a-$Si_{1-x}N_x$: H Superlattices" Philosophical Magazine Letters, vol. 58, No. 4 (1988) pp. 213-218.

* cited by examiner

METHOD AND APPARATUS FOR FORMING A HIGH QUALITY LOW TEMPERATURE SILICON NITRIDE LAYER

CROSS-REFERENCED TO RELATED APPLICATIONS

This application claims benefit of U.S. provisional patent application Ser. No. 60/435,813, filed Dec. 20, 2002, and is a continuation-in-part of U.S. patent application Ser. No. 10/327,467, filed Dec. 20, 2002, now U.S. Pat. No. 7,172,792 all of which are herein incorporated by reference.

BACKGROUND OF THE INVENTION

1. Field of the Invention

The present invention relates to the field of thin layer formation and more particularly to a method and apparatus for forming silicon nitride layers.

2. Discussion of Related Art

Modern integrated circuits are made up of literally millions and millions of transistors integrated together into functional circuits. In order to further increase the computational power or storage capability of integrated circuits, transistor feature size such as gate length and gate oxide thickness must be further scaled down. Unfortunately, as transistor gate lengths are continually scaled, the transistor's electrical characteristics and performance can greatly change due to thermal redistribution of dopants in the device. As such, as devices are further scaled, the thermal budget, i.e., the individual process or cumulative heat input from deposition and process temperatures, used to manufacture the integrated circuit must also be reduced to insure consistent and reliable electrical performance of the device. Additionally, in order to further scale the semiconductor device, the thin layers used to make the devices must be able to be formed with high compositional and thickness uniformity.

One material used in the formation of transistors is silicon nitride. Silicon nitride thin layers are conventionally deposited by thermal chemical vapor deposition (CVD) in semiconductor fabrication processes. For example, silicon nitride layers are used as spacer layers, etch stops, as well as capacitor and interlayer dielectrics. However, present techniques of forming high quality silicon nitride layers in a single wafer reactor utilizing thermal chemical vapor deposition require high deposition temperatures of greater than 750° C. and/or have reduced deposition rates at reduced temperatures, and can result in no appreciable deposition of silicon nitride for transistor fabrication.

Additionally, when silicon nitride layers are deposited at reduced temperatures or at high deposition rates with current processes and precursors, the quality of the layer is generally less than desirable. For example, current silicon nitride precursors including silane, dichlorosilane, disilane, bis-tertbutylaminosilane (BTBAS), and hexachlorodisilane have produced layers with less than desired layer quality, such as low density and high hydrogen content. Disilane and hexachlorodisilane have weak Si—Si bond which allows for acceptable deposition rates, but when used with a nitrogen source such as ammonia either lead to poor film quality (low density and high hydrogen content for both, and poor step coverage and microloading for disilane) or almost unmanageable particle generation (for hexachlorodisilane).

Thus, what is needed is a method of forming a high quality silicon nitride layer by thermal chemical vapor deposition (CVD) at reduced deposition temperatures at a manufacturable deposition rates.

SUMMARY OF THE INVENTION

The present invention generally relates to methods of forming dielectric layer for transistor, such as a silicon nitride layer. According to the present invention, a silicon nitride layer is deposited by thermally decomposing a silicon/nitrogen containing source gas or a silicon containing source gas and a nitrogen containing source gas at reduced deposition temperatures to form a silicon nitride layer. The precursors comprise compounds having Si—N bonds, Si—Cl bonds, or both bonds. The thermally deposited silicon nitride layer is then exposed to hydrogen radicals to form a treated silicon nitride layer. Precursors having one or more Si—Si, N—N or N═N bonds are used to deposit the silicon nitride layer at reduced temperatures.

In one aspect of the invention, a method is provided for processing a substrate including heating a substrate to a temperature of 550° C. or less, thermally decomposing a silicon and nitrogen containing source gas or a silicon containing source gas and a nitrogen containing source gas to deposit a silicon nitride layer on a surface of the substrate, and exposing the silicon nitride layer to hydrogen radicals.

In another aspect of the invention, a method is provided for forming a silicon nitride layer including depositing a silicon nitride layer by thermally decomposing a silicon and nitrogen containing source gas or a silicon containing source gas and a nitrogen containing source gas at a temperature of less than 550° C. and at a deposition rate of greater than 100 Å per minute to a thickness of less than 150 Å and exposing the deposited silicon nitride layer to hydrogen radicals formed by plasma decomposition of a hydrogen containing gas.

In another aspect of the invention, a method is provided for forming a silicon nitride layer including depositing a silicon layer by thermally decomposing a silicon and nitrogen containing source gas or a silicon containing source gas and a nitrogen containing source gas wherein the silicon containing source or the silicon and nitrogen containing source gas includes chlorine and carbon and treating the deposited silicon nitride layer with hydrogen radicals formed by plasma decomposition of a hydrogen containing gas to form a treated silicon nitride layer.

In another aspect of the invention, a method is provided for forming a silicon nitride layer including depositing a silicon nitride layer by thermally decomposing a silicon and nitrogen containing source gas or a silicon containing source gas and a nitrogen containing source gas wherein after depositing the silicon nitride layer the silicon nitride layer has a hydrogen concentration of greater 15 atomic percent and a carbon concentration of greater than 10 atomic percent and treating the deposited silicon nitride layer with hydrogen radicals until the silicon nitride layer as a hydrogen concentration of less than 10 atomic percent and a carbon concentration of less than 5 atomic percent.

In another aspect of the invention, an apparatus is provided for forming a silicon nitride layer including a substrate support located in a chamber for holding a substrate, a heater for heating a substrate placed on the substrate support, a gas inlet for providing a process gas mix comprising a silicon source gas and a nitrogen source gas and/or a silicon/nitrogen source gas into the chamber, means for generating hydrogen radicals from a hydrogen containing gas, and a processor/controller for controlling the operation of the apparatus wherein the processor/controller includes a memory having a plurality of instruction for heating a substrate placed on the substrate support to a temperature of less than 550° C., and for providing a silicon containing source gas and a nitrogen containing source gas or a silicon and nitrogen containing source gas into the chamber while heating the substrate to form a silicon nitride layer on the substrate, and instructions for controlling the means for generating hydrogen radicals for treating the silicon nitride layer with hydrogen radicals.

DETAILED DESCRIPTION OF THE PRESENT INVENTION

The present invention is directed to forming high quality silicon nitride layers that can be formed at reduced deposition temperatures. In the following description numerous specific details, such as deposition and anneal equipment have been set forth in order to provide a thorough understanding of the present invention. However, one of ordinary skill in the art will realize that the invention may be practiced without these specific details. In other instances well known semiconductor processes have not been described in particular detail so as to avoid unnecessarily obscuring the present invention.

Figure 1:
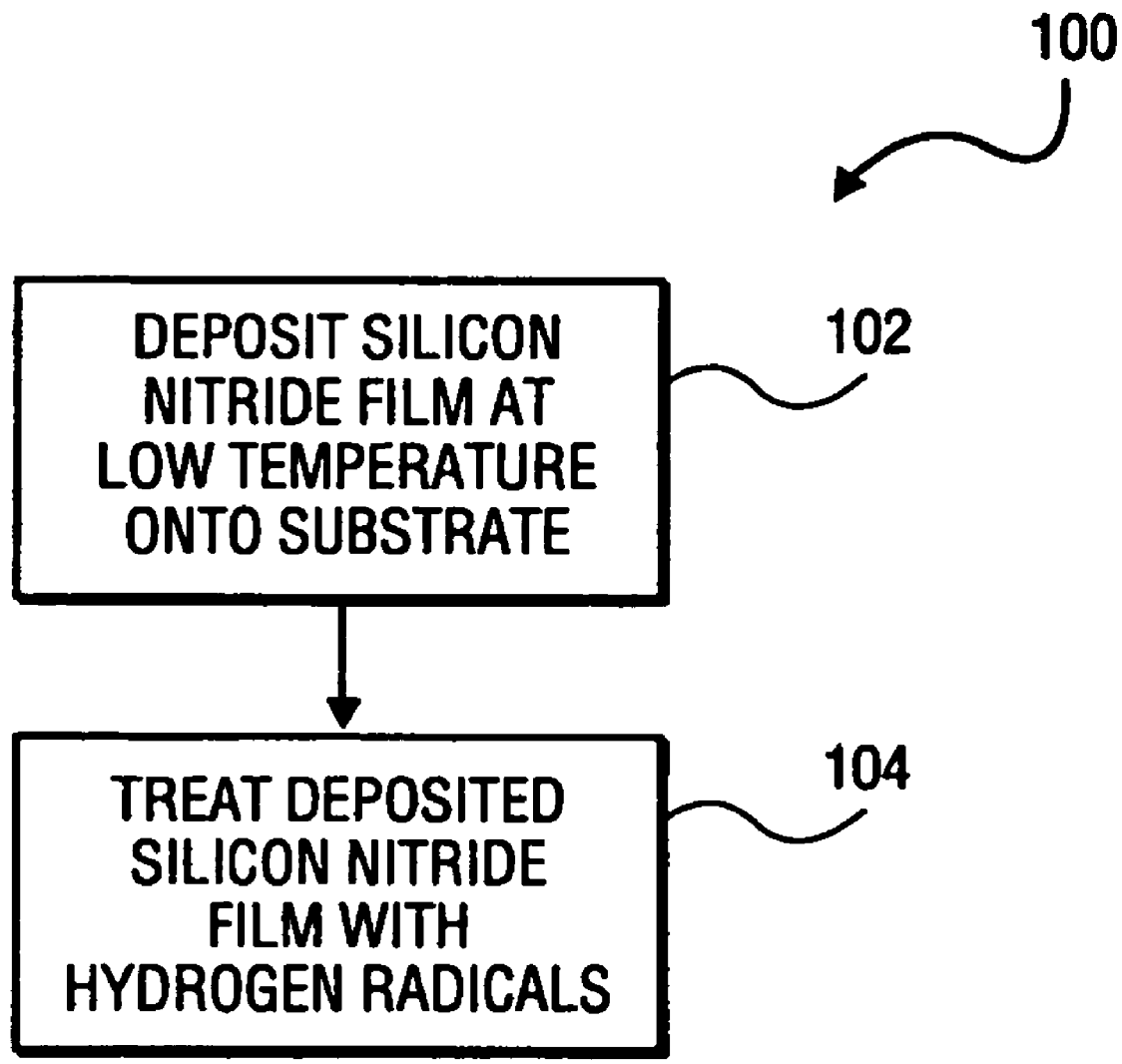
FIG. 1 is a flowchart illustrating one embodiment of a method for forming a silicon nitride layer.

Methods and apparatus are provided for forming a high quality silicon nitride layer at a low deposition temperature of less than 550° C. by thermal chemical vapor deposition (CVD). An example of a method of depositing a silicon nitride layer is generally illustrated in the flow chart of FIG. 1. According to the first step of the present invention, as set forth in block 102 of FIG. 1, a process gas mix comprising a silicon and nitrogen containing source gas or a silicon containing source gas and a nitrogen containing source gas, is thermally decomposed in a chamber at a deposition temperature (substrate temperature) of less than or equal to 550° C., such as less than about 500° C., to produce silicon species and nitrogen species from which a silicon nitride layer is deposited. The source gas or gases are chosen to enable a silicon nitride layer to be formed by thermal chemical vapor deposition at a deposition rate of at least 50 Å per minute and ideally at least 100 Å per minute at low deposition temperatures (i.e., substrate or wafer temperature) of less than or equal to 550° C.

Precursors

Source gases that can be used to produce a silicon nitride layer by thermal chemical vapor deposition at sufficiently high deposition rates at a low temperatures include compounds having one or more Si—N bonds or Si—Cl bonds, such as bis-tertbutylaminosilane (BTBAS) or hexachlorodisilane (HCD or $Si_2Cl_6$). Further inclusion of Si—Si bonds, N—N bonds, N=N bonds, a mixture of Si—N and Si—Cl bonds, or combinations thereof, in the precursor is preferred.

Combination of a Si—Cl functional group (bond) and a Si—N functional group (bond) has been observed to improved step coverage and microloading especially for the ever decreasing temperatures at suitable deposition rates. The number of Si—Cl groups can be varied relative to the number of Si—N groups. The Si—Cl and S—N bonds appear to have different effects on layer properties and deposition properties, and the ratio of Si—N to and S—Cl bonds can be used to balance layer properties and deposition properties.

Compounds having preferred bond structures described above have the generic structures:

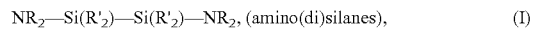
$NR_2$—$Si(R'_2)$—$Si(R'_2)$—$NR_2$, (amino(di)silanes), (I)

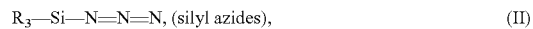
$R_3$—Si—N=N=N, (silyl azides), (II)

or

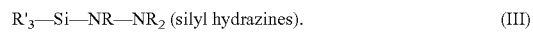
$R'_3$—Si—NR—$NR_2$ (silyl hydrazines). (III)

In the above generic structures, R and R' comprise one or more functional groups selected from the group of a halogen, an organic group having one or more double bonds, an organic group having one or more triple bonds, an aliphatic alkyl group, a cyclical alkyl group, an aromatic group, an organosilicon group, an alkyamino group, or a cyclic group containing N or Si, and combinations thereof.

Examples of suitable functional groups include chloro ($Cl^-$), methyl (—$CH_3$), ethyl (—$CH_2CH_3$), isopropyl, trimethylsilyl, pyrrolidine, and combinations thereof. Examples of suitable compounds include:

1,2-diethyl-tetrakis (diethylamino) disilane, ($CH_2CH_3$ ($NCH_2CH_3)_2Si)_2$ 1,2-dichloro-tetrakis (diethylamino) disilane, (Cl ($NCH_2CH_3)_2Si)_2$ hexakis (N-pyrrolidinio) disilane, $(({C_4H_9N})_3Si)_2$ 1,1,2,2-tetrachloro-bis(di-trimethylamino) disilane, ($Cl_2$ ($NSi(CH_3)_3))Si)_2$ 1,1,2,2-tetrachloro-bis(di-isopropylamino) disilane, ($Cl_2$ ($N(C_3H_7)_2))Si)_2$ 1,2-dimethyl-tetrakis (diethylamino) disilane, ($CH_3$ ($NCH_2CH_3)_2Si)_2$ tris(dimethylamino)silane azide, ($N(CH_3)_2)_3SiN_3$ trimethylamino silane azide, $(CH_3)_3SiN_3$ (2,2 dimethylhydrazine)dimethylsilane $(CH_3)_2SiH$— NH—$N(CH_3)_2$ and combinations thereof.

It is believed that silicon source gas (precursor) or the silicon and nitrogen source gas (precursor) having a silicon to silicon single bond (i.e., Si—Si single bond) enables the molecule to decompose or disassociate at reduced temperatures, such as about 550° C. or less.

A nitrogen source gas or precursor which can be used to deposit a silicon and nitrogen containing layer includes but is not limited to ammonia ($NH_3$), hydrazine $N_2H_4$), hydrogen azide $HN_3$, or a combination thereof. The nitrogen source gas ideally contains a nitrogen-nitrogen single bond (i.e., N—N single bond) for decomposition of the nitrogen source gas at low temperatures. Additionally, when a silicon and nitrogen containing source gas is used in the process gas mix, some amount of a nitrogen source gas will typically also be included in the gas mix for flexible control over the composition of the deposited layer during the layer deposition.

Suitable silicon source gas or the silicon and nitrogen source gas compounds may be adapted to minimize carbon and hydrogen content in the layers. In this respect, Si—C bonds, Si—H bonds, and N—H bonds, are minimized in the precursor bond composition The method of SiN CVD using the engineered precursors will be described from hereon. The CVD process may still require addition of some but minimal amount of NH3 to make a SiN layer stoichiometric. This is still a requirement despite the delivery of nitrogen from the precursor since the incorporation efficiencies for Si and N into the layer are different (different kinetic barriers). Stoichiometric silicon nitride layers will contain <10% C though potentially still >10% H depending on temperature and choice of the R groups. Possible further post-treatments to lower the % H may be employed, as detailed in a separate patent. For the deposition of oxides and oxynitrides using the aminodisilane precursor, addition of an oxidizing agent such as N2O is required.

Figure 2:
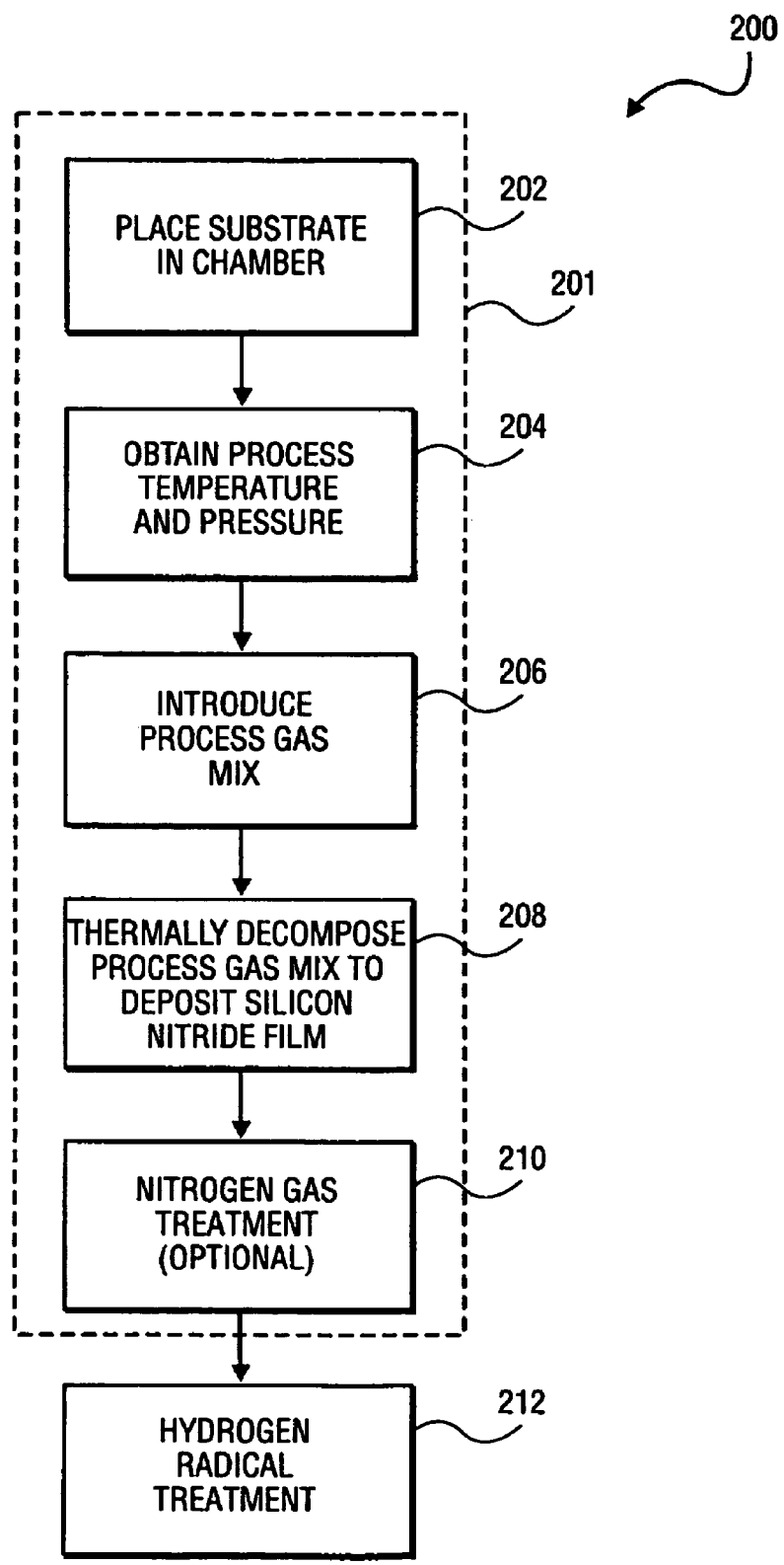
FIG. 2 is a flowchart illustrating one embodiment of method for forming a silicon nitride layer.

An example of a method of depositing and treating a silicon nitride layer in a single wafer reactor in accordance with an embodiment of the present invention is illustrated in flow chart 200 of FIG. 2. The first step is to deposit a silicon nitride layer by thermal chemical vapor deposition onto a wafer or substrate. A specific example of the silicon nitride deposition process is set forth in FIG. 2 as block 201 of flowchart 200 and can comprise steps 202-210 of flow chart 200. The first step in depositing a silicon nitride layer is to place the wafer or substrate into a chamber. Ideally the silicon nitride layer is formed in a chamber of a reduced pressure single wafer cold wall reactor having a resistively heated substrate support for heating the wafer, such as the Applied Materials, Xgen Chamber. An example of a suitable chamber is shown and illustrated in FIG. 4.

Once the substrate has been placed into the chamber, the deposition pressure and temperature used to deposit the silicon nitride layer is achieved. In an embodiment of the present invention, the deposition pressure at which the deposition of silicon nitride layer occurs is between about 10 torr and about 350 torr. The deposition temperature (i.e., the temperature of the wafer or substrate) will depend upon the specific process gases (e.g., silicon containing source gas and nitrogen containing source gas) used to deposit the silicon nitride layer. The wafer or substrate temperature is less than or equal to 550° C., such as less than 500° C., and generally between about 450° C. and about 550° C. during the deposition process.

Next, as set forth in block 206, the process gases are introduced into the deposition chamber. The process gas mix will include at least a silicon containing source gas (i.e., gas which can be decomposed to provide silicon atoms or silicon containing intermediate species for the deposition of the silicon nitride layer) and the nitrogen containing source gas (i.e., a gas which can be thermally decomposed to provide a source of nitrogen atoms or nitrogen containing species for the deposition of a silicon nitride layer) as described herein. Alternatively, the process gas mix may include a silicon/nitrogen source gas which provides from a single molecule a source of both nitrogen and silicon atoms or nitrogen and silicon bearing intermediate species for the formation of silicon nitride layer.

When a silicon and nitrogen source gas is utilized, the process gas mix may also include a nitrogen source gas and/or a silicon source gas or may include just the silicon/nitrogen source gas without additional sources of nitrogen and silicon. In an embodiment of the present invention, the nitrogen source gas is provided into the deposition chamber prior to providing the silicon source gas into the chamber. Alternatively, an inert carrier gas, such as a noble gas including helium and argon, as well as nitrogen ($N_2$), may be introduced into the reaction chamber. The silicon source gas and the nitrogen source gas may be introduced into the processing chamber at a flow rate ratio of between 1:1 and about 1:1000, for example, between about 1:1 and about 1:500.

In an embodiment of the present invention, the silicon source gas is hexachlorodisilane (HCD). A silicon nitride layer can be formed by providing HCD and $NH_3$ or $N_2H_4$ into the chamber. If HCD is utilized it may be mixed with an inert carrier gas, such as $N_2$, prior to being introduced into the reaction chamber. HCD is provided into the reaction chamber at a rate between 10-200 sccm while between 500-5000 sccm of nitrogen source gases is provided to the reaction chamber. In one example, the HCD source gas and the nitrogen source gas have a flow rate of 1:1 and 1:1000 and ideally between 1:1 and 1:500 respectively. Such a process can form a silicon nitride layer at a deposition rate of approximately 80 Å/min at a wafer temperature of 530° C. and at a deposition rate of approximately 50 Å/min at a wafer temperature of 480° C.

A suitable silicon nitride layer can be formed utilizing 1,2-dichloro-tetrakis (diethylamino) disilane a flow rate of 10-100 sccm and a nitrogen source gas at a flow rate between 200-2000 sccm. A suitable silicon nitride layer can be deposited from 1,2-diethrl-tetrakis (diethylamino) disilane at a flow rate between 10-100 sccm and a nitrogen source gas at a flow rate between 200-2000 sccm. Such a process can form a silicon nitride layer at a deposition rate of about 80 Å/min at 530° C. wafer temperature and at a deposition rate of about 50 Å/min at 480° C. wafer temperature. Further examples as follows are detailed process parameters in a single wafer low pressure thermal CVD apparatus such as the Applied Materials SiNgen and preferably with the precursor 1,2-dichloro-tetrakis (diethylamino) disilane and include a substrate temperature between 450° C. and about 650° C., such as about 500° C., a chamber pressure between about 10 torr and about 300 torr, such as between about 40 torr and about 200 torr, an $NH_3$ to silicon precursor flow ratio greater than 10, such as between about 50 and about 100, a silicon precursor flow rate between about 0.2 and about 1.0 gms/min, such as 0.5 gms, and a heater to showerhead spacing between about 500 mils and about 1000 mils, that can result in a deposition rate between 60 and 200 Å/min, for example, about 100 Å/min.

In comparison, the following are details of the SiN CVD process in batch furnaces again preferably with the precursor 1,2-dichloro-tetrakis (diethylamino) disilane and include a substrate temperature between 450° C. and about 650° C., such as about 500° C., a chamber pressure between about 0.1 torr and about 2 torr, such as between about 0.4 torr and about 1 torr, an $NH_3$ to silicon precursor flow ratio less than 10, such as between about 1 and about 5, a silicon precursor flow rate depends on furnace tube volume that can result in a deposition rate between 5 and 20 Å/min, for example, about 12 Å/min.

Next, as set forth in block 208 of flow chart 200, heat from the heated substrate or substrate support causes the silicon and nitrogen source gas or the silicon source gas and the nitrogen source gas to thermally decompose. The thermal decomposition of the silicon source gas provides silicon atoms or silicon containing intermediate species. The thermal decomposition of the nitrogen source gas provides nitrogen atoms or nitrogen containing intermediate species. The thermal decomposition of a silicon and nitrogen source gas can provide both silicon atoms or silicon intermediate species as well as nitrogen atoms or nitrogen intermediate species. The silicon atoms or silicon containing intermediate species react with the nitrogen atoms or nitrogen containing intermediate species to deposit a silicon nitride layer over the surface of the substrate. It is to be appreciated that in the present invention, the silicon/nitrogen containing source gas or the silicon source gas and the nitrogen source gas are thermally decomposed using only thermal energy, such as heat from the substrate or heat from the substrate support without the aid of additional sources of energy, such as photon enhancement or plasma enhancement, refereed to as a plasma-free deposition process. In an embodiment of the present invention, the silicon nitride layer is deposited to a thickness between 10-150 Å with a thickness of less than 120 Å and ideally less than 80 Å being preferred. If thicker layers are desired, a second, third, or other multiple deposition/hydrogen radicals treatment cycles can be used to deposit thicker layers as will be discussed later.

In an embodiment of the present invention, as set forth in block 210, after deposition of a sufficiently thick silicon nitride layer, the flow of the silicon source gas and nitrogen source gas is stopped. In an embodiment of the present invention, when the deposition of the silicon nitride is completed, the substrate can be optionally treated with the nitrogen source gas as set forth in block 210. Only the nitrogen source gas is introduced in the reaction chamber for about 10 seconds. Treating the silicon nitride layer with a nitrogen source gas at the end of the deposition step terminates unreacted silicon sites on the substrate. This operation helps increase the N/Si ratio and reduce hydrogen (specifically in the Si—H bond form) in the silicon nitride layer. However, operation 210 is not necessary to achieve good silicon nitride layers in accordance with the present invention.

The process gas mix utilized in the present invention to deposit the silicon nitride layer enables a silicon nitride layer to be deposited by thermal chemical vapor deposition at a rate of at least 50 Å per minute and ideally at a rate greater than 100 Å per minute at low deposition temperature of less than 550° C. and ideally less than 500° C.

Plasma Treatment

The deposited silicon nitride layer is treated with hydrogen radicals for a predetermined period of time in order to improve the quality of the layer. The hydrogen radicals can be formed by a plasma decomposition of a hydrogen containing gas, such as ammonia ($NH_3$) and hydrogen ($H_2$), either in-situ within the chamber or in a remote device and delivered to the chamber. The as deposited silicon nitride layer can be treated with hydrogen radicals at a flux between $5\times10^{15}$ atomic/$cm^2$– $1\times10^{17}$ atoms/$cm^2$. During the hydrogen radical treatment the substrate is heated to a low temperature of between about 450° C. and about 600° C. and at a chamber pressure between about 100 militorr and about 5 torr. A sufficient treatment can typically occur between about 15 and about 120 seconds.

The hydrogen radicals used for the hydrogen radical treatment can be produced in any suitable manner. In embodiment of the present invention, the hydrogen radicals are formed by plasma decomposition of a hydrogen containing gas which can be decomposed to provide a sufficient number of hydrogen radicals. Hydrogen radicals include all species of atomic hydrogen including highly activated neutral atomic hydrogen, and charged hydrogen ions. A suitable hydrogen source gas includes ammonia ($NH_3$) and hydrogen gas ($H_2$). In embodiment of the present invention, the hydrogen source gas includes a mixture of $NH_3$ and $H_2$. In an embodiment of the present invention, the hydrogen treatment gas includes only $NH_3$ or only $H_2$. Additionally, in an embodiment of the present invention, an inert gas, such as $N_2$, Ar or He can be provided along with the hydrogen treatment gas.

A hydrogen containing gas can be suitably disassociated to provide hydrogen radicals utilizing a microwave or radio-frequency source at a power between 200-2000 watts. The plasma decomposition of a hydrogen treatment gas can be accomplished in-situ or utilizing a remote plasma. In an in-situ process, the plasma and hydrogen radicals are generated in the same chamber in which the substrate having the silicon nitride layer to be treated is located. An example of a suitable plasma chamber includes a capacitively-coupled PECVD or a high density plasma HDP chamber. In a remote plasma treatment, the hydrogen radicals and plasma are generated with microwaves in a chamber separated from the chamber in which the substrate having a silicon nitride layer to be treated as located. In a remote plasma process, the plasma and hydrogen radicals are generated in a first chamber (dissociation chamber or cavity) and then they flow through a conduit from the dissociation chamber and into a second chamber containing a substrate with a silicon nitride layer to be treated. Any suitable remote plasma generator reactor can be used, such as but not limited to an Astex Astron, the Applied Materials Remote Plasma Nitridation RPN source, and the Applied Materials Advanced Strip Passivation Plus (ASP) Chamber.

In an embodiment of the present invention, the hydrogen radicals are formed by a "hot wire" or catalytic decomposition of a hydrogen containing gas, such as ammonia ($NH_3$) and hydrogen gas ($H_2$) or combinations thereof. In a "hot wire" process, a wire or catalyst, such as a tungsten filament is heated to a high temperature of approximately 1600-1800° C. and the hydrogen treatment gas fed over the filament. The heated filament causes the cracking or decomposition of the hydrogen treatment gas to form the hydrogen radicals. The hydrogen radicals then treat a silicon nitride layer formed on a substrate located beneath filament. Although the filament has a high temperature, the substrate is still heated only to a low temperature of less than 600° C. and preferably to less than 550° C. during the treatment process. In yet another embodiment of the present invention, an inductive generated plasma may be utilized to generate the hydrogen radicals.

Because the distance in which the hydrogen radicals can penetrate the silicon nitride layer is limited to about 100Å, for example HCD films, and typically less than 50Å, for example, by silane films, by the low temperature process, a silicon nitride layer of no more than 150 Å and preferably no more than 100 Å is formed prior to hydrogen radical treatment. When thicker silicon nitride layers are desired, multiple deposition and treatment cycles can be used. For example, if a 300 Å silicon nitride layer is desired, first a 100 Å silicon nitride layer can be deposited and then the silicon nitride layer is treated with hydrogen radical. Next, a second 100 Å silicon nitride layer would be deposited on the treated silicon nitride layer and then the second silicon nitride layer treated with hydrogen radicals. Next, a third 100 Å silicon nitride layer would be deposited on the second silicon nitride layer and it treated with hydrogen radicals. In this way, a high quality silicon nitride layer can be formed to any thickness desired. For example, 3 cycles of 180 Å CVD of HCD followed by eight seconds of hydrogen radical exposure indicate 3 layers of 100 Å treated and 80 Å untreated.

For example, a pre-hydrogen radical treatment silicon nitride layer can have a hydrogen concentration of greater than 15 atomic percent with Si—H form of significant fraction, a carbon concentration of greater than 10 atomic percent if an organic silicon precursor is used, a chlorine concentration of greater than 1 atomic percent if a chlorinated silicon precursor is used, a refractive index of less than 1.85, and a wet etch rate of more than two times the etch rate of silicon oxide utilizing an oxide etch, such as a buffered oxide etch (BOE). Such a silicon nitride layer may be considered unsuitable for many applications of silicon nitride layers in semiconductor device fabrication, such as spacers and interpoly dielectrics.

The treated silicon nitride layer has been observed to have a total hydrogen concentration less than 10 atomic percent, reduced fraction of Si—H forms, a carbon concentration, for example, less than five atomic percent, a chlorine concentration, for example, less than one atomic percent, an increased refractive index, for example, greater than 1.90, or a decreased wet etch rate, for example, approximately the same (1:1) etch rate of silicon oxide utilizing an oxide etch, such as BOE.

The process of the present invention enables a high quality silicon nitride layer to be formed by thermal chemical vapor deposition at a low deposition temperature and at a manufacturably high deposition rate (e.g., greater than 50 Å/min). The low deposition temperature enables the silicon nitride layer to be used in semiconductor circuit manufacturing processes at application or locations after transistor or active device formation because the deposition temperature is sufficiently low not to dramatically affect the thermal budget of the device or alter dopant distribution therein. The high deposition rate of the silicon nitride layer enables the process to be implemented in a single wafer reactor.

Fabrication

The method of forming a silicon nitride layer in accordance with the present invention, is ideal for use in the fabrication of semiconductor devices which require a low thermal budget and/or the prevention redistribution of dopants placed in a silicon substrate. One example, for the use of a silicon nitride layer in accordance with the present invention, is in the fabrication of sidewall spacer. In such an application, a substrate, such as substrate 300 shown in FIG. 3A would be provided. Substrate 300 includes a monocrystalline silicon substrate or layer 302 having a gate dielectric layer 304 formed thereon. A gate electrode 306 having laterally opposite sidewalls is formed on the gate dielectric layer. Typically a pair of source/drain tip or extension regions 310 would be formed into the silicon substrate 302 in alignment with the laterally opposite sidewalls of gate electrode 306.

Figure 3A:
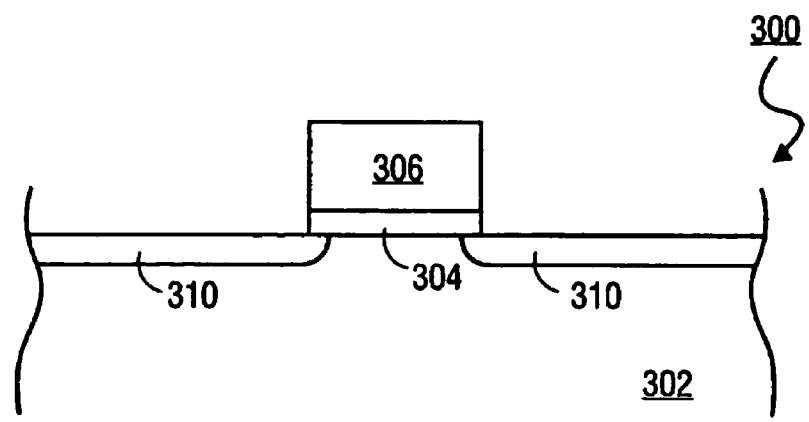
FIGS. 3A-3C are cross-sectional schematic drawings of one embodiment of a method for forming a semiconductor device having sidewall spacers formed from silicon nitride layer.
Figure 3B:
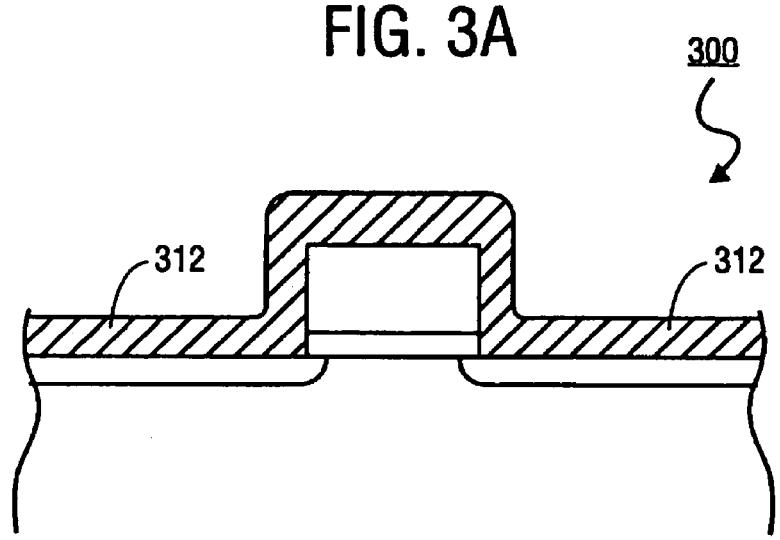

Next, as shown in FIG. 3B a low temperature silicon nitride layer is formed accordance with the present invention, would be blanket deposited over the substrate of FIG. 300. The thickness of the silicon nitride layer 312 depends upon the physical characteristics of the transistor being fabricated, and for a 65 nm technology device would generally be at least 200 Å thick. According to the present invention, a silicon nitride layer would be deposited as described above utilizing a low deposition temperature at a high deposition rate. A silicon nitride layer having thickness of 100 Å or less and ideally less than 50 Å is first formed. The silicon nitride layer is then be annealed with hydrogen radicals as described above. Next, if necessary, a second silicon nitride layer is formed on the hydrogen radical treated first silicon nitride layer. The second silicon nitride layer would then be treated with hydrogen radicals as described above. Next, a third silicon nitride layer would be deposited by a low temperature chemical vapor deposition as described above. The third deposited silicon nitride layer is treated with hydrogen radicals as described above. The process is continued in this manner until a silicon nitride layer 312 having a total thickness desired is formed. In some uses embodiments, a deposited or grown silicon oxide layer is formed prior to the silicon nitride layer, and therefore underlies the silicon nitride layer. Because the silicon nitride layer 312 is formed with a low temperature process and is treated with hydrogen radicals at a low temperature, the dopants forming the source/drain extensions 310 are not substantially moved or redistribute within substrate 302 during the silicon nitride. In this way, the electrical characteristics of the fabricated device would be consistent.

Figure 3C:
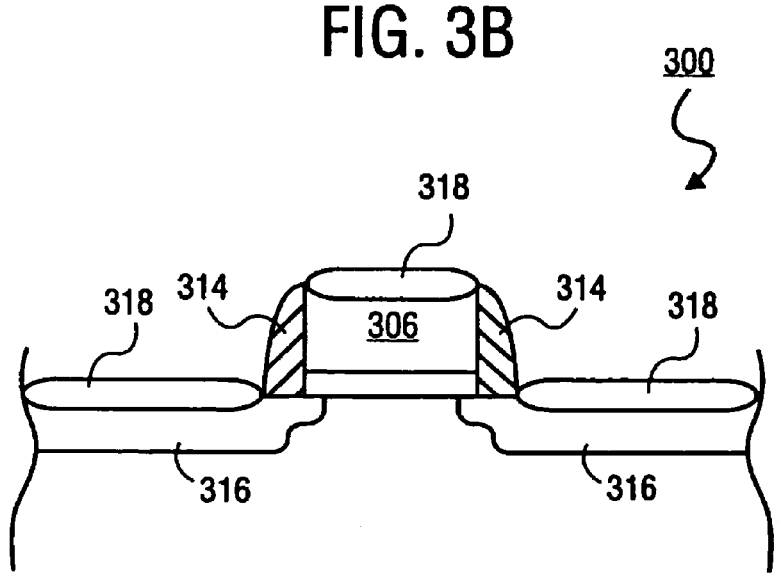

Next, as shown in FIG. 3C, after the formation of a sufficiently thick silicon nitride layer 312, silicon nitride 312 can be anisotropically etched to form sidewall spacers 314 which run along laterally opposite sidewalls of gate electrode 306. The anisotropic etch process removes the silicon nitride layer from horizontal surfaces, such as source/drain extension 310 and the top of gate electrode 306 while leaving silicon nitride on vertical surfaces, such as sidewalls of the gate electrode 306. After formation of the sidewall spacers 314, additional processing of the semiconductor device can occur, such as the formation of deep source/drain regions 316 and/or the formation of silicide 318 on the source/drain regions. Sidewall spacers 314 allow offsettting of the deep source/drain regions and allow silicides, such as titanium silicide or cobalt silicide, to be formed on the source/drain regions and the top of the gate electrode in a self-aligned process as is well known in the art.

Apparatus

Figure 4:
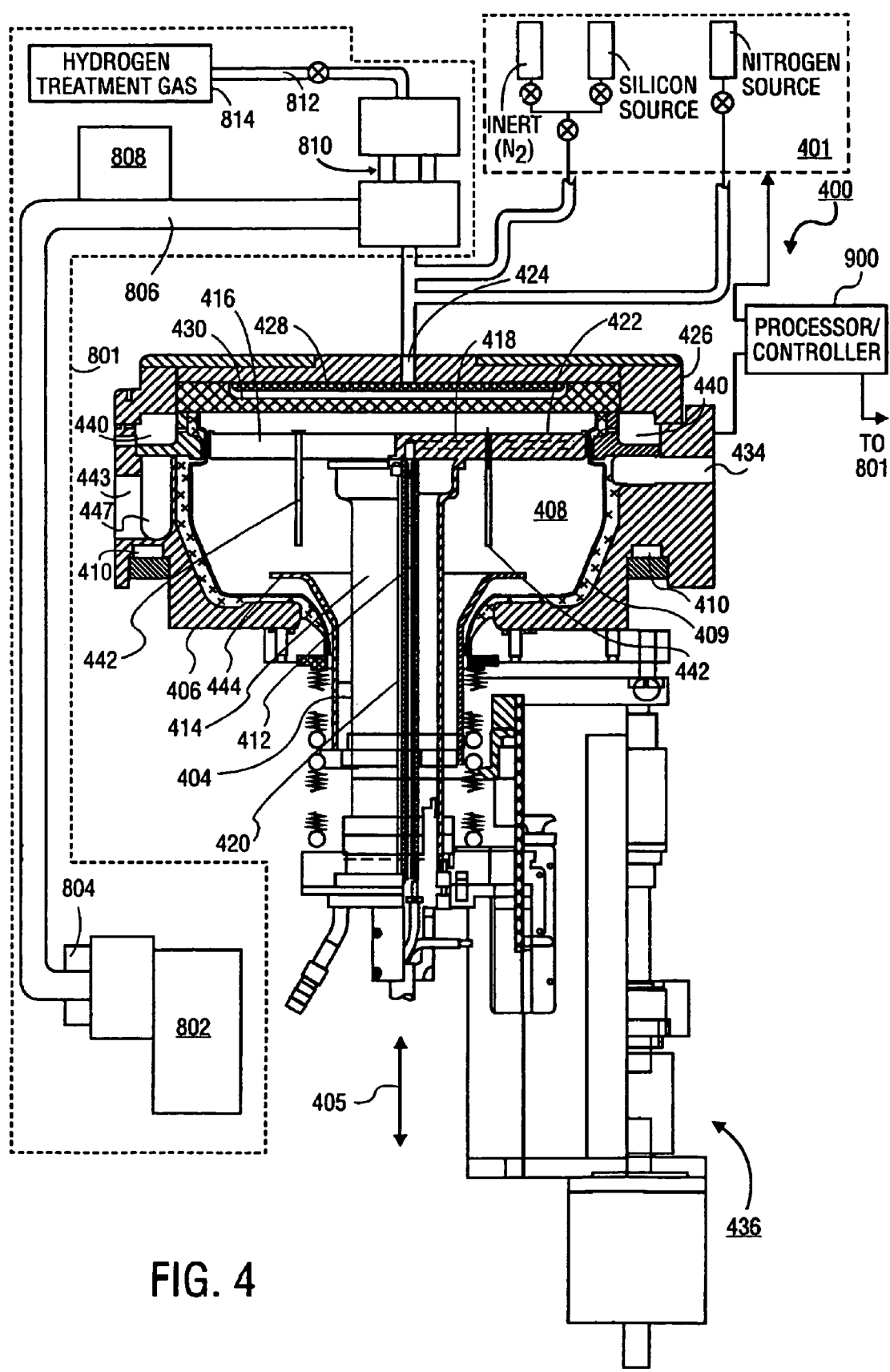
FIG. 4 is cross-sectional schematic drawing of one embodiment of an apparatus which can be used to form a silicon nitride layer.

The silicon nitride layer of the present invention is ideally formed in a low pressure thermal chemical vapor deposition reactor. An example of a suitable reactor 400 is illustrated in FIG. 4. In an embodiment of the present invention, the hydrogen radical treatment can occur in the same chamber as used to deposit the silicon nitride layer. In order to treat the "as deposited" silicon nitride layer with hydrogen radicals in the same chamber used to deposit the layer, a remote plasma source can be coupled to a low pressure chemical vapor deposition reactor to provide a source of hydrogen radicals to the chamber. An example of a remote plasma generator source 801 coupled to a low pressure chemical vapor deposition reactor 400 is also illustrated in FIG. 4. Coupling a remote plasma generator 801 to a thermal chemical vapor deposition reactor 400 greatly improves the throughput of the present invention and enables the silicon nitride layer to be directly treated with hydrogen radicals after the silicon nitride deposition. Additionally, such an apparatus dramatically improves wafer throughput when successive deposition/treatment cycles are used to form thick silicon nitride layers, such as silicon nitride layers greater than 200 Å.

FIG. 4 illustrates a reactor vessel assembly (reactor) 400. FIG. 4 illustrates that the reactor 400 comprises a chamber body 406 that defines a reaction chamber 408 in which process gases, precursor gases, or reactant gases are thermally decomposed to form the silicon comprising layer on a wafer substrate (not shown). The chamber body 406 is constructed of materials that will enable the chamber to sustain a pressure between 10 to about 350 Torr. In one exemplary embodiment, the chamber body 406 is constructed of an aluminum alloy material. The chamber body 406 includes passages 410 for a temperature controlled fluid to be pumped therethrough to cool the chamber body 406. Equipped with the temperature controlled fluid passages, the reactor 400 is referred to as a "cold-wall" reactor. Cooling the chamber body 406 prevents corrosion to the material that is used to form the chamber body 406 due to the presence of the reactive species and the high temperature.

Resident in the chamber body 406 are a reaction chamber 408, a chamber lid 426, a faceplate (or shower head) 430, a blocker plate 428, and a resistive heating assembly 404. The resistive heating assembly 404 includes wire leads 412 running the length of a heater tube 414 that is made of nickel. At the end of the heater tube 414 is a heating disk 416 made out of sintered AIN. Within the heating disk 416 is one or more heating coil 418 made out of molybdenum. The wires 412 and the coil 418 are joined by brazing and are electrically conductive therein. The wires 412 are thermally insulated with AIN ceramic sleeves 420. The coil 418 provides most of the electrical resistance and therefore most of the reaction chamber 408 heating. At the end of the heating disk 416 is a recess called a pocket 422 and within the pocket 422 is placed a wafer (not shown).

FIG. 4 illustrates that the chamber body 408 further houses a lifter assembly 436. The lifter assembly 436 facilitates the moving of the wafer substrate (not shown) in and out of the reaction chamber 408. The lifter assembly 436 can be a stepper motor. The lifter assembly 436 moves the heater assembly 404 up and down along an axis 405 to facilitate the moving of the wafer substrate in and out of the reaction chamber 408.

A substrate or wafer is placed into the reaction chamber 408 through the entry port 434 by for example, a robotic transfer mechanism (not shown). In one embodiment, the robotic transfer mechanism couples to a transfer blade and the robotic transfer mechanism controls the transfer blade. The transfer blade inserts the substrate through the opening to load the substrate into the reaction chamber 408 and onto pocket 422 of the heating disk 416. As the substrate is being loaded, the lifter assembly 436 lowers the heater assembly 404 and the heating disk 416 in an inferior direction along the axis 405 so that the surface of the heating disk 416 is below the entry port 434. As the heating disk 416 is lowered, the substrate is placed in the reaction chamber 408. Once the substrate is loaded, the entry 434 is sealed and the lifter assembly 436 moves or advances the heater assembly 404 and the heating disk 416 in a superior (e.g., upward) direction toward the faceplate 430. In one exemplary embodiment, the advancement stops when the wafer substrate is a short distance (e.g., 400-900 mils) from the faceplate 430.

In one exemplary embodiment, when ready for deposition or processing, process gases or precursor gases controlled by a gas panel 401 are introduced into the reaction chamber 408. The blocker plate 428 has a plurality of holes (not shown) to accommodate a gas flow therethrough. The process gas is introduced into the reaction chamber 408 first through the port 424, through the blocker plate 428, and then through the faceplate 430. The process gas is distributed from the port 424 through the plurality of holes in the blocker plate 428 and then through the faceplate 430. The faceplate 430 uniformly distributes the process gas into the reaction chamber 408.

The substrate can be removed from the chamber by for example inferiorly (lowering) the heater assembly 404. As the heating assembly 404 moves in an inferior direction, through the action of the lifter assembly 436, the lift pins 442, contact the contact lift plate 444 and remain stationary and ultimately, extend above the top surface of the heating disk 416 to separate the substrate from the heating disk 416 as it is lowered. A transfer blade is then inserted through opening 434 and is positioned between the substrate and the heating disk 416. The contact lift plate 444 is then lowered, thereby lowering the lift pins 442 and causing the substrate to be lowered onto the transfer blade. The substrate can then be removed through the entry port 434 by the transfer blade.

The mechanism described above may be repeated for subsequent substrates. A detailed description of one suitable lifter assembly 436 is described in U.S. Pat. No. 5,772,773, which is assigned to Applied Materials, Inc. of Santa Clara, Calif.

The reactor 400 also includes a temperature indicator (not shown) to monitor the processing temperature inside the reaction chamber 408. In one example, the temperature indicator can be a thermocouple, which is positioned such that it conveniently provides data about the temperature at the surface of the heating disk 416 (or at the surface of a substrate supported by the heating disk 416). In reactor 400 the temperature of a substrate is slightly cooler, 20-30° C. than the temperature of the heating disk 416.

FIG. 4 further illustrate that the reaction chamber 408 is lined with a temperature-controlled liner or an insulation liner 409. As mentioned above, the chamber body 406 includes the passages 410 for a temperature controlled fluid to create the cold-wall chamber effect. The reaction temperature inside reaction chamber 408 can be as high as 600° C. or even more. With the chemistry that is used to form the layer in the reaction chamber 408, high temperature will easily corrode the chamber body 406 of the reaction chamber 408. Hence, the chamber body 406 is equipped with the passages 410 for a temperature controlled fluid such as water or other coolant fluid that will cool the chamber body 406. This will prevent the chamber body 406 from getting too hot which will cause the chamber body 406 to be easily corroded. One problem that may associate with such a cold-wall chamber is that the areas inside the reaction chamber 408 that are in close proximity with the chamber's cold-wall tend to experience a sharp drop in temperature. The sharp drop in temperature in these areas encourages formation or condensation of particles that are undesirable or unfavorable for the silicon comprising layers formed in the reaction chamber 408. For example, the reaction of HCD and $NH_3$ in a deposition process to form a silicon nitride ($Si_3N_4$) layer typically causes the formation of $NH_4Cl$. $NH_4Cl$ is an undesirable salt by-product that requires cleaning to prevent contamination to the $Si_3N_4$ being formed. When the temperature drops below about 150° C., condensation such as $NH_4Cl$ will occur. These particles may become dislodged from the chamber wall. The dislodged particles form nucleation sites for particle formations on the wafer substrates. In one embodiment, the reaction chamber 408 is lined with the temperature-controlled line 409 to prevent the undesirable condensation of particles.

In one embodiment, the temperature-controlled liner 409 is coupled to the wall of the chamber body 406 such that the temperature-controlled liner 409 only has a few physical contacting points along the wall of the chamber body 406. (See for example, contacting points 459 illustrated in FIG. 4). Minimizing the physical contacts between the temperature-controlled liner 409 and the wall of the chamber body 406 minimizes heat loss to the chamber body 406 by minimizing conducting points.

A purge gas (e.g., nitrogen) can be fed into the bottom of the reaction chamber 408 during deposition to prevent unwanted deposition.

The reactor 400 also couples to a pressure regulator or regulators (not shown). The pressure regulators establish and maintain pressure in the reaction chamber 408. Such pressure regulators are known in the field. The pressure regulator(s) that can be used for the exemplary embodiments must be able to maintain pressure at a level in the range of about 10 Torr to about 350 Torr. Alternatively, the reactor 400 may also be coupled to a gas pump-out system (not shown), which is well-known in the field to pump gases out of the reaction chamber 408. The gas pump-out system (which may include for example, throttle valve(s)) can also be used to control the pressure in the reaction chamber 408. The reactor 400 also couples to sensors (not shown), which monitor the processing pressure within the reaction chamber 408.

In one embodiment, a controller or processor/controller 900 is coupled to the chamber body 406 to receive signals from the sensors, which indicate the chamber pressure. The processor/controller 900 can also be coupled to the gas panel 401 system to control the flow of the nitrogen source gas, the silicon source gas, and inert and/or purge gas. The processor 900 can work in conjunction with the pressure regulator or regulators to adjust or to maintain the desired pressure within the reaction chamber 408. Additionally, process/controller can control the temperature of the heating disk, and therefore the temperature of a substrate placed thereon. Processor/controller 900 includes a memory which contains instructions in a computer readable format for controlling the nitrogen source gas flow, the silicon source gas flow and the inert gas flow, as well as the pressure in the chamber and temperature of the heating disk within parameters set forth above in order to form a silicon nitride layer in accordance with the present invention. For example, stored in memory of processor/controller 900 are instructions for heating a substrate to a temperature less than or equal to 550° C. and instructions for providing a silicon source gas, and a nitrogen source gas and/or a silicon/nitrogen source gas into chamber 408 while heating the substrate to a temperature of less than or equal 550° C., as well as instructions for controlling the pressure within chamber 408 to between 10-350 torr.

The materials for components in the reactor 400 are selected such that the exposed components must be compatible with high temperature processing of the present invention. The thermal decomposition of the precursors or the reactant species of the present invention to form the silicon comprising layer involves temperature inside the reaction chamber 408 up to as high as 600° C. The materials for the components in the reactor 400 should be of the types that withstand such high temperature. In one embodiment, the chamber body 406 is made out of a corrosion resistant metal such as hard anodized aluminum. Such type of aluminum is often expensive. Alternatively, the chamber body 406 includes the passages 410 for a temperature-controlled fluid to be passed through. The passage of the temperature-controlled fluid enables the chamber body 406 to be made out of a very inexpensive aluminum alloy or other suitable metal since the passages 410 will keep the chamber body 406 cool. As mentioned, this is one of the reasons why the reactor 400 is often referred to as a cold-wall reactor. To prevent unwanted condensation on the cold-wall or the cooled chamber body 406, the temperature-controlled liner 409 described above can be made out a material that will absorbs the heat radiated from the reaction chamber 408 and keeps the temperature of the temperature-controlled liner 409 to at least about or greater than 150° C. or alternatively to at least about of greater than 200° C. depending on the layer forming applications. In one embodiment, the temperature-controlled liner 409 needs to be maintained at a temperature that is sufficient to prevent unwanted condensation.

Additionally, the component materials should also be compatible with the process gases and other chemicals, such as cleaning chemicals and the precursors that may be introduced into the reaction chamber 408. In one embodiment, the exposed surfaces of the heating assembly 404 may be comprised of a variety of materials provided that the materials are compatible with the process. For example, the exemplary embodiments in this discussion require corrosive chemistry to be applied at high temperatures. The components of the heating assembly thus must withstand this environment. In one example, the components of the heating assembly are made out of a ceramic material such as aluminum nitride (AlN). The heating disk 416 of the heating assembly 404 may also be comprised of aluminum nitride material.

In one exemplary embodiment, the reaction chamber 408 is stabilized using a stabilization gas such as $N_2$, He, Ar, or combinations thereof. In one example, a manifold is included in the gas panel system 401 which will release the stabilization gas into the reaction chamber 408. The stabilization gas can have a flow rate ranging from 1,000 sccm to 10,000 sccm, preferably, about 2,000 sccm for a reactor 400 having a capacity of 5-6 liters.

In an embodiment of the present invention, reactor 400 is coupled to a remote plasma generator 801 which generates and provides hydrogen radicals to deposition chamber 408. Remote plasma generator 801 includes a magnetron 802 which generates microwaves with a microwave source. Magnetron 802 can preferably generate up to 10,000 watts of 2.5 Ghz microwave energy. It is to be noted that the amount of power required is dependent (proportional) to the size of chamber 408. For an anneal chamber used to process 300 mm wafers, 10,000 watts of power should be sufficient. Although a microwave source is used to generate a plasma in apparatus 800, other energy sources such as radio frequency (RF) may be used.

Magnetron 802 is coupled to an isolator and dummy load 804 which is provided for impedance matching. The dummy load absorbs the reflected power so no reflective power goes to the magnetron head. Isolator and dummy load 804 is coupled by a wave guide 806, which transmits microwave energy to an autotuner 808. Autotuner 808 consist of an impedance matching head and a separate detector module that uses three stepper motor driven impedance matching stubs to reduce the reflective power of the microwave energy directed to the power source. Autotuner 808 focuses the microwave energy into the center of a microwave applicator cavity (or chamber) 810 so that energy is absorbed by hydrogen treatment gas fed into the applicator cavity 810 by conduit 812. Although an autotuner is preferred a manual tuner may be employed.

Applicator 810 uses microwave energy received from magnetron 802 to create a plasma from the hydrogen treatment gas as it flows down through a quartz plasma tube located inside applicator 810. A source 814, such as a tank, of a hydrogen treatment gas such as but not limited to $H_2$ and $NH_3$ used for generating the hydrogen radicals is coupled to microwave applicator 810. Additionally, a source of an inert gas such as argon (Ar), or helium (He) can also be coupled to applicator 810. A prefire mercury lamp can be used to radiate ultraviolet light into the plasma tube to partially ionize the process gases and thereby make it easier for the microwave energy to ignite the plasma.

The microwave energy from magnetron 802 converts the hydrogen treatment gas into a plasma which consist of essentially three components; ionized or charged hydrogen atoms, activated (reactive) electrically neutral hydrogen atoms, and intermediate hydrogen containing species, all of which for the purposes of the present invention constitute "hydrogen radicals".

Applicator 810 can be bolted to the lid of apparatus 400. The concentrated plasma mixture flows downstream through conduit 814 to chamber 408. Because the hydrogen radicals are generated at location (chamber 810) which is separated or remote from the chamber 408 in which the substrate to be annealed is located, the hydrogen radicals are said to be "remotely generated".

Remote plasma source 801 can be coupled to processor/controller 900. Processor/controller 900 can include instructions stored in memory in a computer readable format, which controls the operation of remote plasma source 801 to achieve the hydrogen radical treatment process described above. Instructions can include for example, instructions to control hydrogen treatment gas flow rate and power to obtain the desired hydrogen radical flux necessary to treat the silicon nitride layer, such as a flux between $5 \times 10^{15}$ atoms/$cm_2$ and $1 \times 10^{17}$ atoms/$cm^2$ and can also include instructions for controlling the temperature of the heating disk (and therefore the temperature of the wafer) as well as instructions to control the pressure within chamber 408 during the hydrogen radical treatment process.

Additionally, although the present invention has been described with respect to utilizing a single wafer apparatus, the deposition and treatment processes of the present invention can also be carried out in a semi-batch or tube type apparatus, if desired, without departing from the scope of the present invention.

Figure 5:
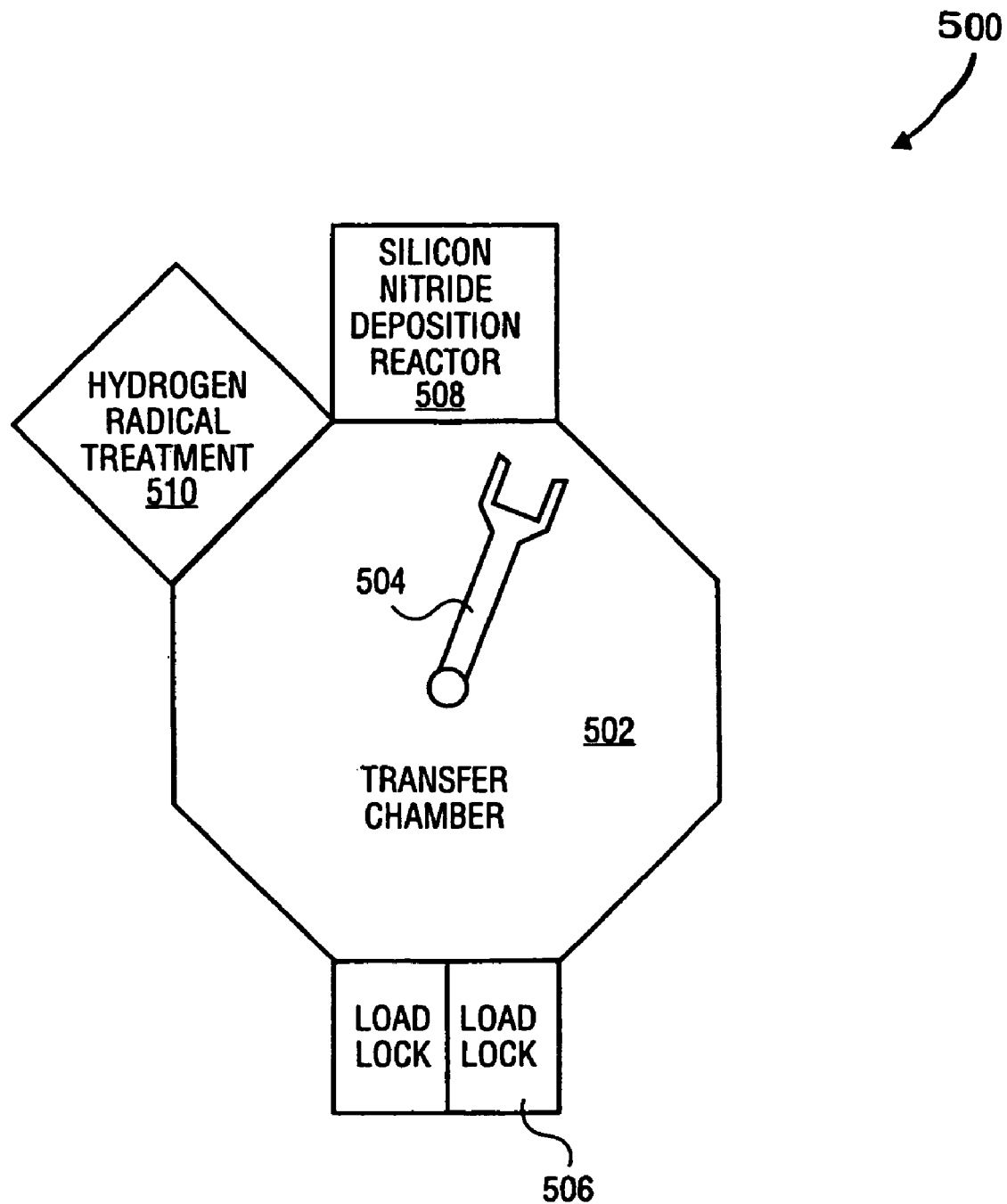
FIG. 5 is a top plan view of one embodiment of a cluster tool which can be used to form a silicon nitride.

In an alternative embodiment of the present invention, the low temperature silicon nitride deposition process can be carried out in a cluster tool, such as cluster tool 500 as shown in FIG. 5. Cluster tool 500 includes a sealable transfer chamber 502 having a wafer handler 504, such as a robot, contained therein. A load lock or a pair of load locks 506 are coupled to the transfer chamber 502 through a sealable door to enable wafers to be brought into and out of cluster tool 500 by robot 504. Coupled to transfer chamber 502 by a sealable door is a silicon nitride deposition reactor 508, such as an Applied Materials Xgen single wafer, cold wall, thermal chemical vapor deposition reactor having a resistive heater. Also coupled to transfer chamber 502 by a sealable door is hydrogen radical treatment chamber 510 as shown in FIG. 5. The hydrogen radical treatment chamber can be for example, a plasma chamber, such as a Applied Materials Advanced Strip Passivation Plus (ASP) Chamber, a remote plasma chamber, such as Applied Materials Remote Plasma Nitridation RPN chamber, or a "hot wire" chamber. Typically, transfer chamber 502 is held at a reduced pressure and contains an inert ambient, such as $N_2$. In this way, wafers can be transferred from one chamber (e.g., silicon nitride deposition chamber 508) to a second chamber (e.g., hydrogen radical treatment chamber) and vice versa without exposing the wafer to an oxidizing ambient or to contaminants. Cluster tool 500 can also include a processor/controller 900 as described above to control the operation of the silicon nitride deposition reactor 500 as well as the hydrogen radical treatment chamber 510 to deposit a silicon nitride layer as described above and to treat the silicon nitride layer with hydrogen radicals as described above.

In use, a wafer or substrate, such as the wafer shown in FIG. 3A, is brought into transfer chamber 502 by robot 504 from load lock 506. The wafer is transferred into the silicon nitride deposition chamber 508, the door therebetween sealed and a silicon nitride layer formed thereon with a low deposition temperature process. Once a silicon nitride layer has been formed thereon, the wafer is removed by robot 504 from silicon nitride deposition chamber 508 and brought by robot 504 into hydrogen radical treatment chamber 510. The door between hydrogen radical treatment chamber 510 and transfer chamber 502 is then sealed and the silicon nitride layer exposed to hydrogen radicals as described above. If a thicker silicon nitride layer is desired, the wafer can be removed from chamber 510 and brought back into silicon nitride deposition chamber 508 in order to deposit additional silicon nitride. The wafer would once again be removed from silicon nitride deposition chamber 508 and brought back into hydrogen radical treatment chamber 510 and treated with hydrogen radicals once again. The wafer can be continually transferred between the deposition chamber 508 and the treatment chamber 510 until a silicon nitride layer of the desired thickness and quality is obtained. Once a substantially thick silicon nitride layer is formed, the wafer is removed from cluster tool 500.

Thus, a method and apparatus for depositing and treating a high quality silicon nitride layer at a low deposition temperature has been described.

What is claimed is:

1. A method of processing a substrate in a processing chamber, comprising:
heating a substrate to a temperature of 550° C. or less;
thermally decomposing a silicon and nitrogen containing source gas or a silicon containing source gas and a nitrogen containing source gas to deposit a silicon nitride layer on a surface of the substrate, wherein the silicon containing source gas or the silicon and nitrogen containing source gas comprises a compound having bonds selected from the group of Si—Si, N=N, N—N, or combinations thereof and the silicon nitride layer has a first hydrogen atomic percent of greater than 15 atomic percent; and
exposing the silicon nitride layer to hydrogen radicals, wherein the hydrogen radicals are formed by plasma decomposition of a hydrogen containing source gas, and the exposed silicon nitride layer has a second hydrogen atomic percent of less than 10 atomic percent.

2. The method of claim 1, wherein the hydrogen containing source gas comprises ammonia ($NH_3$), hydrogen gas ($H_2$), or a combination of ammonia ($NH_3$) and hydrogen gas ($H_2$).

3. The method of claim 1, wherein the silicon nitride layer is treated with hydrogen radicals at a flux between $5 \times 10^{15}$ atoms/cm$^2$–$1 \times 10^{17}$ atoms/cm$^2$.

4. The method of claim 1, wherein hydrogen containing source gas further comprises an inert gas selected from the group consisting of nitrogen gas ($N_2$), argon (Ar) and helium (He).

5. The method of claim 1, wherein the plasma decomposition of the source gas occurs physically remote from the chamber in which the silicon nitride layer is treated with hydrogen radicals.

6. The method of claim 1, wherein the thermal decomposition temperature is less than 500° C.

7. The method of claim 1, wherein the silicon nitride layer is formed at a deposition rate of greater than 100 Å per minute.

8. The method of claim 1, wherein the silicon containing source gas or the silicon and nitrogen containing source gas comprises a first silicon atom bonded to a second silicon atom by a single bond and at least a chlorine (Cl) atom or a nitrogen (N) atom bonded to the first silicon atom and the second silicon atom.

9. The method of claim 8, wherein the silicon nitride layer has a chlorine concentration of less than 1.0 atomic percent after exposing the silicon nitride layer to hydrogen radicals.

10. The method of claim 8, wherein an organo group is bonded to a nitrogen atom.

11. The method of claim 10, wherein the silicon nitride layer has a carbon concentration of less than 5 atomic percent after exposing the silicon nitride layer to hydrogen radicals.

12. The method of claim 1, wherein the silicon containing source gas or the silicon and nitrogen containing source gas comprises a compound selected from the group having the structures of $R_2N$—Si($R'_2$)—Si($R'_2$)—$NR_2$, $R_3$—Si—$N_3$, $R'_3$—Si—NR—$NR_2$, wherein R and R' comprise one or more functional groups selected from the group of a halogen, an organic group having one or more double bonds, an organic group having one or more triple bonds, an aliphatic alkyl group, a cyclical alkyl group, an aromatic group, an organosilicon group, an alkyamino group, or a cyclic group containing N or Si, and combinations thereof.

13. The method of claim 12, wherein R and R' comprise one or more functional groups selected from the group of chloro, methyl, ethyl, isopropyl, trimethylsilyl, pyrrolidine, and combinations thereof.

14. The method of claim 13, wherein the silicon containing source gas or the silicon and nitrogen containing source gas comprises 1,2-dichloro-tetrakis (diethylamino) disilane.

15. The method of claim 12, wherein the silicon nitride layer has a chlorine concentration of less than 1.0 atomic percent after exposing the silicon nitride layer to hydrogen radicals, the silicon nitride layer has a carbon concentration of less than 5 atomic percent after exposing the silicon nitride layer to hydrogen radicals, or a combination thereof.

16. The method of claim 1, further comprising:
depositing a second silicon nitride layer onto the treated silicon nitride layer by thermally decomposing a silicon and nitrogen containing source gas or a silicon containing source gas and a nitrogen containing source gas; and
exposing the second silicon nitride layer with hydrogen radicals.

17. The method of claim 16, further comprising:
depositing a third silicon nitride layer on the second treated silicon nitride layer by thermally decomposing a silicon and nitrogen containing source gas or a silicon containing source gas and a nitrogen containing source gas; and
exposing the third silicon nitride layer with hydrogen radicals.

18. The method of claim 1, wherein the silicon nitride deposited layer is treated with hydrogen radicals at a temperature between 450° C. and 600° C.

19. The method of claim 1, wherein after treating the silicon nitride layer, the silicon nitride layer has a second hydrogen atomic percent of less than 10 atomic percent, a refractive index of greater than or equal to 1.90 after exposing the silicon nitride layer to hydrogen radicals, an etch rate of approximately the same as the etch rate of silicon oxide utilizing a buffered oxide etch, or a combination thereof.

20. The method of claim 1, wherein the thermally decomposing a silicon and nitrogen containing source gas or a silicon containing source gas and a nitrogen containing source gas is performed at a chamber pressure between about 10 torr and about 350 torr.

21. A method of forming a silicon nitride layer in a processing chamber, comprising:
depositing a silicon nitride layer by thermally decomposing a silicon and nitrogen containing source gas or a silicon containing source gas and a nitrogen containing source gas at a temperature of less than 550° C. and at a deposition rate of greater than 100 Å per minute to a thickness of less than 150 Å and the deposited silicon nitride layer has a first hydrogen atomic percent of greater than 15 atomic percent; and
exposing the deposited silicon nitride layer to hydrogen radicals formed by plasma decomposition of a hydrogen containing gas, and the exposed silicon nitride layer has a second hydrogen atomic percent of less than 10 atomic percent.

22. The method of claim 21, wherein the silicon containing source gas or the silicon and nitrogen containing source gas is selected from the group consisting of an organo-di- or mono-silane or an organoamino-di or mono-silane.

23. The method of claim 21, wherein the hydrogen containing source gas comprises ammonia ($NH_3$), hydrogen gas ($H_2$), or a combination of ammonia ($NH_3$), hydrogen gas ($H_2$).

24. The method of claim 21, wherein the deposited silicon nitride layer is treated with hydrogen radicals having a flux of between $5\times10^{15}$ atoms/cm$^2$–$1\times10^{17}$ atoms/cm$^2$.

25. The method of claim 21, wherein the plasma decomposition is remote from the chamber in which the deposited silicon nitride layer is exposed to hydrogen radicals.

26. The method of claim 21, wherein the deposited silicon nitride layer is exposed to the same chamber in which the deposited silicon nitride layer is deposited.

27. The method of claim 21, wherein the thermally decomposing a silicon and nitrogen containing source gas or a silicon containing source gas and a nitrogen containing source gas is performed at a chamber pressure between about 10 torr and about 350 torr.

28. A method of forming a silicon nitride layer in a processing chamber, comprising:
depositing a silicon nitride layer by thermally decomposing a silicon and nitrogen containing source gas or a silicon containing source gas and a nitrogen containing source gas wherein the silicon containing source or the silicon and nitrogen containing source gas comprises chlorine and carbon and the silicon nitride layer has a first hydrogen atomic percent of greater than 15 atomic percent; and
treating the deposited silicon nitride layer with hydrogen radicals formed by plasma decomposition of a hydrogen containing gas to form a treated silicon nitride layer and the treated silicon nitride layer has a second hydrogen atomic percent of less than 10 atomic percent.

29. The method of claim 28, wherein the thermally decomposing a silicon and nitrogen containing source gas or a silicon containing source gas and a nitrogen containing source gas is performed at a chamber pressure between about 10 torr and about 350 torr.

* * * * *

UNITED STATES PATENT AND TRADEMARK OFFICE
CERTIFICATE OF CORRECTION

| | | |
|---|---|---|
| PATENT NO. | : 7,972,663 B2 | Page 1 of 1 |
| APPLICATION NO. | : 10/741417 | |
| DATED | : July 5, 2011 | |
| INVENTOR(S) | : Wang et al. | |

It is certified that error appears in the above-identified patent and that said Letters Patent is hereby corrected as shown below:

In the Detailed Description of the Present Invention:

Column 4, Lines 27-29, please delete

"1,2-dichloro-tetrakis (diethylamino) disilane, (Cl $(NCH_2CH_3)_2Si)_2$ hexakis (N-pyrrolidinio) disilane, $((C_4H_9N)_3)Si)_2$"

and insert

--1,2-dichloro-tetrakis (diethylamino) disilane, (Cl $(NCH_2CH_3)_2Si)_2$ hexakis (N-pyrrolidinio) disilane, $((C_4H_9N)_3)Si)_2$-- therefor;

Column 4, Line 38, please delete "(2,2 dimethylhydrazine)dimethylsilane" and insert --(2,2 dimethylhydrazine)dimethylsilane,-- therefor;

Column 10, Line 54, please delete "AIN" and insert --AlN-- therefor;

Column 10, Line 58, please delete "AIN" and insert --AlN-- therefor;

Column 13, Line 50, please delete "(AIN)" and insert --(AlN)-- therefor.

Signed and Sealed this

Twenty-seventh Day of September, 2011

David J. Kappos
*Director of the United States Patent and Trademark Office*